US006969919B2

(12) United States Patent
Yajima et al.

(10) Patent No.: US 6,969,919 B2
(45) Date of Patent: Nov. 29, 2005

(54) SEMICONDUCTOR PACKAGE PRODUCTION METHOD AND SEMICONDUCTOR PACKAGE

(75) Inventors: Kiyoshi Yajima, Oita (JP); Mutsumi Masumoto, Beppu (JP); Chihiro Hatano, Sakura (JP); Kimitaka Nishio, Kimitsu (JP); Noriyuki Kirikae, Sodegaura (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/865,276

(22) Filed: Jun. 10, 2004

(65) Prior Publication Data

US 2005/0003577 A1 Jan. 6, 2005

Related U.S. Application Data

(60) Continuation of application No. 10/391,005, filed on Mar. 18, 2003, now Pat. No. 6,774,496, which is a division of application No. 09/952,038, filed on Sep. 11, 2001, now Pat. No. 6,716,674.

(30) Foreign Application Priority Data

Sep. 11, 2000 (JP) ....................................... 2000-275343

(51) Int. Cl.[7] ................................................ H01L 23/29

(52) U.S. Cl. ........................ 257/789; 257/787; 257/788

(58) Field of Search ................................ 257/687, 783, 257/787–792, 795, 678

(56) References Cited

U.S. PATENT DOCUMENTS 6,303,982 B2 * 10/2001 Murakami et al. .......... 257/666

* cited by examiner

*Primary Examiner*—Brad Smith
(74) *Attorney, Agent, or Firm*—Yingsheng Tung; Wade James Brady, III; Frederick J. Telecky, Jr.

(57) ABSTRACT

A semiconductor package production method containing a step in which a bond layer made of a single-layer film thermoset bond is provided on the back of a wafer on which many semiconductor devices are formed, a dicing tape is pasted onto its bond layer side, and the bond layer and the wafer are diced simultaneously in order to obtain semiconductor devices with the bond layer, and a step in which the semiconductor devices with the bond layer are detached from the dicing tape and die-attached to interposing substrates serving as bodies to which they are bonded; wherein, the aforementioned film thermoset bond contains an epoxy resin, an epoxy resin hardener, and a phenoxy resin as well as 50–80 wt % of spherical silica, and the bond layer is 100 μm or thicker. A semiconductor device made by this method and a wafer for use with this method.

13 Claims, 1 Drawing Sheet

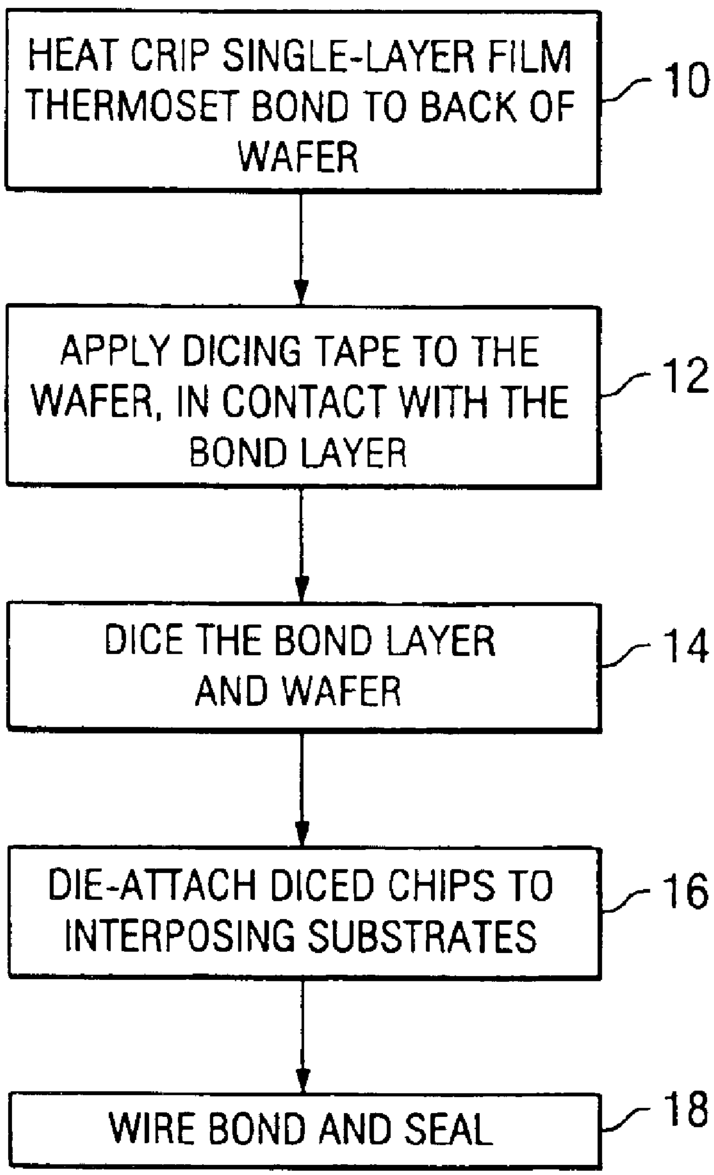
HEAT CRIP SINGLE-LAYER FILM THERMOSET BOND TO BACK OF WAFER
10
APPLY DICING TAPE TO THE WAFER, IN CONTACT WITH THE BOND LAYER
12
DICE THE BOND LAYER AND WAFER
14
DIE-ATTACH DICED CHIPS TO INTERPOSING SUBSTRATES
16
WIRE BOND AND SEAL
18

SEMICONDUCTOR PACKAGE PRODUCTION METHOD AND SEMICONDUCTOR PACKAGE

This is a continuation of application Ser. No. 10/391,005 filed Mar. 18, 2003, now U.S. Pat. No. 6,774,496, which is a divisional of application Ser. No. 09/952,038 filed Sep. 11, 2001, now U.S. Pat. No. 6,716,674, which clais priority of application No. 2000-275343 filed on Sep. 11, 2000 in Japan.

FIELD OF THE INVENTION

The present invention pertains to a semiconductor package production method and a semiconductor package produced using said method.

BACKGROUND OF THE INVENTION

Conventionally, a Au—Si eutectic alloy, solder, and silver paste, for example, have been utilized as die attachment materials for bonding a semiconductor device (referred to also as a chip, hereinafter) to a bonding body, such as an interposing substrate, among the materials used for configuring a semiconductor package. Currently, as far as general-purpose and large-scale semiconductor packages are concerned, bonding using silver paste constitutes the mainstream in overall consideration of productivity, heat radiation, applicability to large-scale semiconductor devices, and price. The silver paste is applied to a bonding body, such as an interposing substrate, by means of a dispensing method, achieving excellent productivity since temporary crimping of semiconductor devices can be achieved easily. On the other hand, there was a problem that because it was liquid, control over the bonding thickness, coating positions, complete filling, and suppression of voids was difficult to achieve.

In recent years, surface terminal layout chip size packages (CSP, hereinafter) and ball grid arrays (BGA) have become popular in place of peripheral terminal layout type quad flat packages (QFP, hereinafter) and have made a great contribution in terms of weight reduction, thinning, and downscaling of portable devices. The substrates utilized in such methods are referred to as interposing substrates in differentiation from the printed-circuit board to be actually installed. Because the structure is designed so that the size of the semiconductor device and the outer dimension of the semiconductor package are almost the same, the bond layer for bonding the semiconductor device to the interposing substrate is required to be free of overflow and insufficient filling and to have almost the same area as that of the semiconductor device.

In addition, because voids formed inside the bond layer significantly affect the moisture resistance reliability (resistance to corrosion of the wiring on the semiconductor device when unused for an extended period of time and subjected to moisture) and the antihygroscopic reflow characteristic (resistance to cracking and peeling inside the package caused when reflow soldering is applied after being unused for an extended period of time and subjected to moisture), elimination of voids in the bond layer is also demanded. Based on these points, a void-free film bond with high thickness accuracy and high positional accuracy while achieving productivity equivalent to that of the conventional paste bond has been in demand.

Die attachment utilizing a film bond is disclosed, for example, in Japanese Kokai Patent Application No. Sho 63[1988]-289822 and Japanese Kokai Patent Application No. Hei 1[1989]-19735. However, with the methods described in these patents, the film bond needed to be cut according to the size of a given semiconductor device first, many kinds of dies had to be prepared, and an expensive dedicated device was needed when pasting the film. Furthermore, a great portion of the film was wasted when it was worked to the size of the semiconductor device, and many kinds of slit products had to be prepared for each semiconductor device size in order to eliminate said waste film.

Thus, methods in which the wafer is diced into semiconductor devices with the bond after the film bond is pasted onto its back are shown, for example, in Japanese Kokai Patent Application No. Hei 11 [1999]-219962 and Japanese Kokai Patent Application No. Hei 7[1995]22440. However, the materials used for the film bonds described in these patents had problems in that because they had a high melt viscosity due to high polymer ratio, they needed to be laminated onto the wafer at a high temperature, that the dicing was dull, and that the die attachment required a high temperature, high pressure, and a long period of time. Although it is feasible to use a material containing an oligomer as the main ingredient for the bond layer in order to achieve low-temperature lamination, and although the lamination and die attachment can be achieved quickly at a low temperature and a low pressure using a material made primarily of oligomer, such as an epoxy resin, the problem that the dicing cannot be carried out continuously for a prolonged period of time due to the fouled dicing blade caused by melting of the resins during dicing has not yet been solved.

As a method for improving the temperature resistance cycle characteristic after being assembled into a package like a CSP and mounted onto a printed-circuit board, the point that the bond layer is to be made 100 μm thick or thicker is described in Japanese Kokai Patent Application No.2000-31327; wherein a method in which bond layers are formed on both sides of a heat-resistant film serving as a base is shown as an example. However, although said method was superior in terms of the temperature resistance cycle characteristic, because it had poor dicing performance, a film bond with a film thickness of 100 μm or thicker was in demand in order to achieve high-level dicing performance.

Furthermore, because the surface mounted semiconductor packages, such as CSPs, were mounted onto both sides of the printed-circuit board, a high-level antihygroscopic reflow characteristic under high temperature, high humidity, and long-term moisture absorption condition was in demand. For example, in a mounting method utilizing a reflow furnace as a typical surface mounting technology (SMT), solder is melted using various heat sources, such as infrared rays, hot blasts, and lasers, for mounting; and reflow resistance during said operation was needed.

The purpose of the present invention is to present a semiconductor production method with an excellent dicing characteristic by which low-temperature die attachment can be achieved, and an excellent temperature resistance cycle characteristic and an antihygroscopic reflow characteristic can be attained after mounting onto a printed-circuit board, and to present a semiconductor package produced using said method.

SUMMARY OF THE INVENTION

The present inventors conducted investigations in order to achieve the aforementioned objective and found that the aforementioned problem can be solved by regulating the bond layer utilized particularly in the semiconductor production method, and thus completed the present invention.

That is, the present invention is a semiconductor package production method characterized as containing a step in which a bond layer made of a single-layer film thermoset bond is provided on the back of a wafer on which many semiconductor devices are formed in order to obtain a wafer with a bond layer, a step in which a dicing tape is pasted onto the bond layer's side of the wafer with the bond layer, and the bond layer and the wafer are diced simultaneously in order to obtain semiconductor devices with the bond layer, and a step in which the semiconductor devices with the bond layer are detached from the dicing tape and die-attached to interposing substrates serving as bodies to which they are bonded; wherein, the aforementioned bond layer made of the film thermoset bond is 100 μm thick or thicker, and the thermoset bond contains 50–80 wt % of spherical silica. It is desirable that the film thermoset bond utilized here essentially contains a glycidyl ether epoxy resin, an epoxy resin hardener, and a phenoxy resin. In addition, the present invention pertains also to semiconductor packages produced using the semiconductor package production method.

DESCRIPTION OF EMBODIMENTS

The semiconductor package production method of the present invention contains a step in which a bond layer made of a single-layer film thermoset bond is provided on the back of a wafer on which many semiconductor devices are formed in order to obtain a wafer with a bond layer, a step in which a dicing tape is pasted onto the bond layer's side of the wafer with the bond layer, and the bond layer and the wafer are diced simultaneously in order to obtain semiconductor devices with the bond layer, and a step in which the semiconductor devices with the bond layer are detached from the dicing tape and die-attached to interposing substrates.

The semiconductor package produced in accordance with the present invention is a semiconductor package referred to as a wire-bonding type CSP in which a semiconductor device die-attached to a bonding body, such as an interposing substrate, is electrically connected to the bonding body using metal wires. To produce this kind of semiconductor package, after each piece of semiconductor device is cut out from the wafer using a dicing device and bonded to the interposing substrate via a die attachment bond, the semiconductor device and the bonding body are electrically connected through wire bonding using metal wires and sealed using a resin through transfer-molding or potting, and solder balls are then mounted. In the present invention, the bond layer is formed on the wafer surface prior to the wafer dicing, and the wafer with the bond layer is diced in order to regulate the size of the bond layer to be the same as that of the chip.

First, the step in which a bond layer made of a single-layer film thermoset bond is heat-crimped onto the back of a wafer formed with semiconductor devices in order to obtain a wafer with a bond layer will be explained.

As a representative wafer to be used here, a silicon wafer, usually formed with a semiconductor circuit on one side and usually of size 6 in, 8 in, or 12 in may be mentioned.

Although lamination, screen printing (including metal mask), spin coating, and so forth may be mentioned as a film bond layer formation method utilized in the present invention, it is desirable to laminate a bond preshaped into a film (sheet) through heating or under standard temperature.

As an example involving lamination, a composite for the bond layer is dissolved in a solvent with a low boiling point to make it into a varnish, said varnish is applied to a base material film, such as PP or PET, a releasing treatment is applied, and heat-drying is applied to remove the solvent in order to create a bond in the shape of a film (sheet). Usually, it is desirable to heat-crimp said film bond onto the back of the wafer, for example, the pasting is carried out at 70–150° C. under a pressure of 0.1–1 MPa·cm (1–10 kg/cm linear pressure) using a heat laminator made of heat-resistant silicone rubber.

Thickness of the bond layer to be formed here should be as thick as possible in order to improve the temperature cycle characteristic after it is mounted onto the mother board. Thus, it needs to be 100 μm or thicker in order to achieve 1000 cycles or more in terms of temperature resistance cycle characteristic at −40° C./125° C. for a semiconductor package utilizing 0.5 mm solder balls at 0.8 mm pitch. Furthermore, because the range of the design for the thickness of the semiconductor package will be exceeded if the bond layer is 200 μm or thicker, 100–200 μm is desirable.

In terms of stress reduction, it is desirable to match as closely as possible the coefficient of linear expansion of said bond layer with the coefficient of linear expansion of the interposing substrate serving as a bonding body. As a method for reducing the coefficient of linear expansion of the bond layer, although it is effective to add ceramic elements (silica and alumina) to the bond, it is desirable to add spherical silica in order to restrain significant increase in the resin viscosity and to reduce the wear on the blade during dicing, and 50–80 wt % of spherical silica needs to be contained from the viewpoint of reduction of the coefficient of linear expansion.

The utilization of the bond-added wafer as is the case in the present invention has the advantage that the thickness and the size of the bond can be fixed accurately, so that the reliability of the semiconductor package can be improved. Here, reliability refers to the temperature resistance cycle characteristic obtained after the semiconductor package is mounted onto the printed-circuit board, as well as cracking and peeling inside the package during the reflow soldering due to the moisture absorbed prior to its mounting. One of the characteristics of the present invention is that die attachment of the semiconductor device to the interposing substrate under a low temperature and a low pressure and the long-term continuous dicing characteristic are realized at the same time. Said characteristic can be realized when the oligomer content of the resin elements in the bond layer is high, and 50–80 wt % of spherical silica is contained.

Next, the step in which the dicing tape is pasted to the wafer with the bond layer on the bond layer's side of the wafer with the bond layer, and the bond layer and the wafer are diced in order to obtain the semiconductor device with the bond layer will be explained. When pasting the dicing tape to the wafer with the film bond layer, the bond layer of the wafer and the adhesive layer of the dicing tape held by a metal die frame are brought into contact. Well-known UV-curable or non-UV-curable type dicing may be utilized; and heat and pressure may also be applied during the lamination, as needed.

In the present invention, the bond layer and the wafer are diced simultaneously because the target of the dicing is the bond-added wafer. Although the dicing can be achieved using a single-blade dicing device without any problem, it is desirable to dice the wafer layer and the bond layer separately using a twin-blade dicing device.

The bond-added semiconductor device created in said manner is die-attached to the bonding body, such as the interposing substrate. Although an ordinary die attachment device may be used for the die attachment, it is desirable for the die attachment stage to be heated in order to achieve low-temperature low-pressure die attachment.

The semiconductor device having gone through the die attachment step is usually wire-bonded and sealed using a resin. Although a wire-bonding device can be used for the wire-bonding, one in which metal wires are melted by means of heat and ultrasonic waves for coupling is preferable in order to achieve low-temperature short-term coupling. In addition, the resin sealing can be achieved using any method as long as it is a sealing method, such as transfer molding, potting, and printing, utilized for an ordinary semiconductor package.

To describe the aforementioned bond layer in further detail, it needs to be 100 μm or thicker. In addition, the timing characteristic can be improved by regulating the ratio of the spherical silica contained in the bond layer, so that an even more desirable semiconductor package can be presented.

It is desirable that spherical molten silica powders are used for the spherical silica utilized in the present invention. The ratio of the spherical silica content needs to fall in the range of 50–80 wt %; preferably, in the range of 60–75 wt %. When the ratio of the silica content is restricted to said range, not only the aforementioned coefficient of linear expansion becomes easier to control, but the die attachment characteristic under low-temperature, low-pressure, and short-term conditions can be improved. In addition, the dicing can be carried out continuously without staining or wearing of the blade during the dicing. When the spherical silica is less than 50 wt %, the resin element melts onto the blade, and with continuous dicing over a long period of time, it becomes disabled. In addition, when the spherical silica exceeds 80 wt %, a hard and brittle bond layer is created due to the lack of resin element serving as a binder, so that cracks and voids are likely to occur, and heat crimping performance is deteriorated significantly. Molten silica powder obtained through a heat melt method based on a method in which a natural silica rock as a raw material is eluted under a high temperature, a method in which fumed silica obtained using silicon tetrachloride is melted into a spherical shape, a method in which metal silicon is combusted by means of explosion, or a sol-gel method using alkoxlsilane as a raw material are desirable for the spherical silica utilized in the present invention. Although it is desirable to use spherical silica with an average grain diameter of 0.1–30 μm, it is preferable to combine a multiple number of spherical silicas with different average grain diameters, for example, average grain diameters of 5 μm and 0.5 μm, in order to attain a wider grain distribution.

In terms of the composition of the bond containing spherical silica, it is desirable that a glycidyl ether epoxy resin, an epoxy resin hardener, and a phenoxy resin are contained as essential elements in addition to the spherical silica. Preferably, these essential elements take up 50 wt % or more, or preferably, 80 wt % or more, of the elements other than the spherical silica In addition, it is advantageous to have 10–50 parts by weight of epoxy resin hardener and 10–50 parts by weight of phenoxy resin relative to 100 parts by weight of glycidyl ether epoxy resin.

A single or multiple number of mixtures may be utilized for the glycidyl ether epoxy resin. It is desirable that a usable glycidyl ether epoxy resin has a molecular weight of 2000 or less; for example, phenol novolac glycidyl ether, o-cresol novolac glycidyl ether, fluorene bisphenol glycidyl ether, triazine naphthol glycidyl ether, naphthalene glycidyl ether, triphenyl glycidyl ether, tetraphenyl glycidyl ether, bisphenol A glycidyl ether, bisphenol F glycidyl ether, bisphenol AD glycidyl ether, bisphenol S glycidyl ether, and trimethylolmethane glycidyl ether may be mentioned. Of these, those containing 2 or more glycidyl ether radicals in the molecule are particularly desirable.

Although known hardeners, such as amines, acid anhydrides, and polyhydric phenols, may be utilized for the epoxy resin hardener, a latent hardener which hardens at a specified temperature and quickly is more desirable. Dicyandiamide, imidazoles, hydrazides, boron-trifluoride-amine complex, amine amide, and polyamine acid as well as its modified and microcapsule types may be given as examples of the latent hardener. These may be utilized either individually or as a combination of two or more. When a latent hardener is used, a thermoset bond layer with high storage stability which can be stored at room temperature over a long period of time can be presented.

A known phenoxy resin may be utilized for the phenoxy resin. Phenoxy resin is a thermoplastic resin with a molecular weight of 10,000 or more obtained usually from bisphenol, such as bisphenol A, and epichlorohydrin. Because said phenoxy resin has a similar structure to that of an epoxy resin, it has good phase solubility and adhesiveness. While a desirable phenoxy resin has a bisphenol A main skeleton, commercially available phenoxy resins, such as a bisphenol A/F mixed phenoxy resin and a borominated phenoxy resin, may also be mentioned as desirable resins.

Although resin elements and additives other than the aforementioned essential elements may be contained in the bond of the present invention as long as the characteristics of the bond of the present invention are not ruined, it is desirable that the softening point of the composite after the spherical silica is removed fall within the range of 60–90° C. When the range of the softening point is restricted to said range, the film characteristic and the dicing characteristic can both be attained when a film bond containing the spherical silica is created.

Embodiment 1

60 parts of o-cresol novolac solid epoxy resin ( $\overline{M}$n=approximately 1000), 40 parts of bisphenol A liquid epoxy resin ($\overline{M}$w=approximately 400), and 30 parts of phenoxy resin ($\overline{M}$w=approximately 50,000) with the bisphenol A main skeleton were mixed at specified ratios to obtain a resin mixture with a softening point of 70° C., and said resin mixture was heat-dissolved in a methyl isobutyl ketone solvent. 260 parts of spherical silica (average grain diameter of 6 μm) were added to 130 parts of the solidity in the obtained resin varnish and kneaded for 30 min using a planetary mixer. 25 parts of HX-3742 (manufactured by Asahi Chiba) were added as a latent hardener and stirred evenly in order to obtain a bond varnish defoamed under reduced pressure. Said bond varnish was coated to a thickness of 120 μm on a 50 μm-thick PET film that had been given a releasing treatment and dried, and dried for 10 min at 100° C. to create a bond sheet (film bond with PET film).

Next, the aforementioned bond sheet was thermally laminated with the PET film onto the back of a 300 μm thick 6-in silicon wafer having aluminum wiring on the front, while the back of the wafer and bond layer were brought into contact under conditions of 100° C., 0.2 MPa·cm, and 2 m/min in order to obtain a wafer with a bond layer.

Subsequently, the PET film was removed; and a UV-curable dicing tape was laminated together with a die onto said wafer with the bond layer and diced into 8.0×8.0 mm size using a twin-blade dicing device in order to obtain a bond-added semiconductor device. Said bond-added semiconductor device was die-attached to a polyamide interposing substrate formed with a circuit on one side using a die attachment device at 150° C., 500 g, for 0.5 sec. Sealing by resin was carried out using a transfer molding device. Finally, solder balls with a diameter of 0.5 mm were mounted onto the back of the package in order to create a chip-size package to be examined.

COMPARATIVE EXAMPLES 1 AND 2

Chip-size packages to be examined were created under the same conditions as those in Embodiment 1 except that 650 parts or 130 parts of spherical silica were mixed in.

COMPARATIVE EXAMPLE 3

A chip-size package to be examined was created under the same conditions as those in Embodiment 1 except that the bond sheet was 60 μm thick.

COMPARATIVE EXAMPLE 4

While the bond sheets were pasted onto the silicon wafers in advance in Embodiment 1 and Comparative Examples 1 through 3, in Comparative Example 4, the bond sheet was pasted onto the interposing substrate in advance, and the semiconductor device (chip) was die-attached to said bond sheet in order to compare the characteristics with those of Embodiment 1 based on the difference in terms of package production method.

A 120-μm-thick bond sheet was created using the method described in Embodiment 1, diced into 8.5 mm×8.5 mm size almost identical to the size of the semiconductor device, and heat-crimped onto a polyimide interposing substrate under 100° C., 0.2 MPa·cm, and 3 sec. The PET film was removed later, and the 8.0×8.0 mm chip to be examined was die-attached to said bond surface using a die attachment device under 150° C., 500 g, and 2 sec. Subsequently, a chip-size package was created using the method described in the embodiment.

Evaluations of the characteristics in the embodiment and the comparative examples were carried out according to the following evaluation method. The results are listed in Table 1 along with the mixture compositions of the bonds.

Evaluation of Continuous Dicing Characteristic 500-line dicing was applied to the bond-added wafer, and the resin adhered to the blade was evaluated by means of microscopic observation. In addition, the presence of cracks and voids at the time of the dicing was evaluated by sight.

Die Attachment Characteristic

The crimping time was varied while the other crimping conditions were fixed to 150° C. and 500 g; the results were observed using a microscope.

Temperature Resistance Cycle Characteristic

The respective chip-size packages obtained in the embodiment and the comparative examples were mounted onto a 1.6-mm-thick FR-4 substrate, and a temperature cycle test was carried out under −40° C./125° C. (retention time of 30 min) conditions; wherein, the evaluations were made based on the cycle at which defects began to occur.

Antihygroscopic Reflow Characteristic: JEDEC; L-2a

After the aforementioned chip-size packages had been applied with moisture under 60° C., 60%, and 120 h and subjected to IR reflow 3 times, observations were made using an ultrasonic flaw detector (SAT) in order to check for internal cracks and peeling.

TABLE 1

| | Embodiment | Comparative example 1 | Comparative example 2 | Comparative example 3 | Comparative example 4 |
|---|---|---|---|---|---|
| Bond heat-crimped part | Wafer | Wafer | Wafer | Wafer | Substrate |
| Epoxy resin | 100 | 100 | 100 | 100 | 100 |
| Latent hardener | 25 | 25 | 25 | 25 | 25 |
| Phenoxy resin | 30 | 30 | 30 | 30 | 30 |
| Spherical silica | 260 | 650 | 130 | 260 | 260 |
| Amount of silica filled (wt %) | 63 | 81 | 46 | 63 | 63 |
| Thickness of bond layer (gm) | 120 | 120 | 120 | 60 | 120 |
| Continuous dicing characteristic | ⊚ Stain on the blade absent | X Crack(s) present | X Stain on the blade present | ⊚ Stain on the blade absent | — |
| Die attachment characteristic | <1 sec | — | <1 sec | <1 sec | 2 sec |
| Temperature resistance cycle characteristic | >1000 | — | 950 | 800 | >1000 |
| Antihygroscopic reflow characteristic L-2a | 0/16 | — | — | — | |

As shown in Table 1, when the spherical silica is within the 50–80 wt % range, an excellent continuous dicing characteristic and an excellent die attachment characteristic were demonstrated regardless of the thickness of the bond layer. In addition, when the bond layer was 100 μm or thicker, an excellent temperature resistance cycle characteristic at 1000 cycles or higher was demonstrated. It was also found from Comparative Example 4 that a superior antihygroscopic reflow characteristic could be attained when the film heat-curing bond was pasted onto the wafer in advance rather than when the film heat-curing bond was pasted onto the substrate in advance.

Effect of the Invention

In the present invention, because the single-layer bond layer is formed on the wafer prior to the dicing, and an appropriate amount of spherical silica is contained in said bond layer, a semiconductor package can be produced for which reliability in terms of temperature resistance cycle characteristic and anti-hygroscopic reflow characteristic as well as workability (productivity) in terms of die attachment characteristic and dicing characteristic are both attained.

What is claimed is:

1. A semiconductor device, comprising:

a semiconductor chip having a first side; and a single-layer thermoset bond film including a glycidyl ether epoxy resin, an epoxy resin hardener, a phenoxy resin, and spherical silica having an average grain diameter of between 0.1 and 30 μm on a second side of the semiconductor chip, opposite said first side.

2. The semiconductor device of claim 1, wherein the thermoset bond film is at least 100 μm thick, and contains 50 to 80 wt % of spherical silica.

3. The semiconductor device of claim 1, wherein the thermoset bond film contains 60 to 75 wt % spherical silica.

4. The semiconductor device of claim 1, wherein the spherical silica comprises multiple spherical silicas having average grain diameters of between 0.5 and 5.0 μm.

5. A semiconductor device comprising:

a semiconductor chip having a first side; and a single-layer thermoset bond film on a second side of the semiconductor chip, opposite said first side, the thermoset bond film comprising a glycidyl ether epoxy resin, an epoxy resin hardener, a phenoxy resin, and spherical silica;

wherein the glycidyl ether epoxy resin, epoxy resin hardener, and phenoxy resin comprise at least 50% of the elements of the thermoset bond film other than the spherical silica.

6. The semiconductor device of claim 5, wherein the thermoset bond film includes 10 to 50 parts by weight of epoxy resin hardener and 10 to 50 parts by weight of phenoxy resin relative to 100 parts by weight of glycidyl ether epoxy resin.

7. The structure of claim 5, wherein the glycidyl ether epoxy resin, epoxy resin hardener, and phenoxy resin comprise at least 80% of the elements of the thermoset bond film other than the spherical silica.

8. The method of claim 5, wherein the thermoset bond film includes 10 to 50 parts by weight of epoxy resin hardener and 10 to 50 parts by weight of phenoxy resin relative to 100 parts by weight of glycidyl ether epoxy resin.

9. A semiconductor device comprising:

a semiconductor chip having a a first side; and a single-layer thermoset bond film on a second side of the semiconductor chip, opposite said first side, the thermoset bond film comprising a glycidyl ether epoxy resin having a molecular weight of 2000 or less, an epoxy resin hardener, and a phenoxy resin.

10. The structure of claim 9, wherein said glycidyl ether epoxy resin is selected from the group consisting of: phenol novolac glycidyl ether, o-cresol novolac glycidyl ether, fluorine bisphenol glycidyl ether, triazine naphthol glycidyl ether, naphthalene glycidyl ether, triphenyl glycidyl ether, tetraphenyl glycidyl ether, bisphenol A glycidyl ether, bisphenol F glycidyl ether, bisphenol AD glycidyl ether, bisphenol S glycidyl ether, and trimethylolmethane glycidyl ether.

11. The structure of claim 9, wherein the epoxy resin contains two or more glycidyl ether radicals per molecule.

12. A semiconductor device comprising:

a semiconductor chip having a first side; and a single-layer thermoset bond film on a second side of the semiconductor chip, opposite said first side, the thermoset bond film comprising a glycidyl ether epoxy resin, an epoxy resin hardener, and a phenoxy resin;

wherein the epoxy resin hardener is selected from the group consisting of: amines, acid anhydrides, polyhydric phenols, dicyandiamide, imidazoles, hydrazides, boron-trifluoride-amine complex, amine amide, polyamine acid and its modified and microcapsule types.

13. A semiconductor device comprising:

a semiconductor chip having a first side; and a single-layer thermoset bond film on a second side of the semiconductor chip, opposite said first side, the thermoset bond film comprising a glycidyl ether epoxy resin having a molecular weight of 2000 or less, an epoxy resin hardener, and a phenoxy resin;

wherein the phenoxy resin is selected from the group consisting of: a bisphenol such as bisphenol A, epichlorohydrin, a bisphenol A/F mixed phenoxy resin, and a borominated phenoxy resin.

* * * * *